United States Patent [19]
Wang et al.

[11] Patent Number: 6,046,703
[45] Date of Patent: Apr. 4, 2000

[54] COMPACT WIRELESS TRANSCEIVER BOARD WITH DIRECTIONAL PRINTED CIRCUIT ANTENNA

[75] Inventors: Guan-Wu Wang, Hsinchu; Wen-Chung Liu, Chung-Li; Terng-Jie Lin, Keelung, all of Taiwan

[73] Assignee: Nutex Communication Corp., Hsinchu, Taiwan

[21] Appl. No.: 09/189,727

[22] Filed: Nov. 10, 1998

[51] Int. Cl.[7] ................................................ H01Q 9/28
[52] U.S. Cl. ............................ 343/795; 343/700 MS; 343/803; 343/819
[58] Field of Search ................... 343/795, 815, 343/818, 819, 833, 834, 803, 841, 837, 702, 700 MS

[56] References Cited

U.S. PATENT DOCUMENTS

| | | | |
|---|---|---|---|
| 4,812,855 | 3/1989 | Coe et al. | 343/700 MS |
| 4,825,220 | 4/1989 | Edward et al. | 343/795 |
| 5,008,681 | 4/1991 | Cavallaro | 343/700 MS |
| 5,220,335 | 6/1993 | Huang | 343/819 |
| 5,420,596 | 5/1995 | Burrell et al. | 343/700 MS |
| 5,539,414 | 7/1996 | Keen | 343/702 |
| 5,828,340 | 10/1998 | Johnson | 343/700 MS |

*Primary Examiner*—Don Wong
*Assistant Examiner*—Tan Ho

[57] ABSTRACT

A wireless transceiver includes a dielectric substrate having first and second major surfaces on which an RF circuit and a baseband processing circuit are mounted, and a printed circuit antenna formed on the substrate. The printed circuit antenna has at least one director formed by strip conductors disposed on the substrate, a reflector formed by the edge of a ground area disposed on the substrate, and a dipole formed by strip conductors on the substrate. The dipole is positioned between the reflector and the director. An antenna with this low profile and compact antenna structure has high directivity.

16 Claims, 7 Drawing Sheets

COMPACT WIRELESS TRANSCEIVER BOARD WITH DIRECTIONAL PRINTED CIRCUIT ANTENNA

FIELD OF THE INVENTION

This invention relates to a wireless transceiver used in radio communication and more particularly to a wireless transceiver integrated with a printed circuit antenna on a dielectric board.

BACKGROUND OF THE INVENTION

Wireless communication has become more and more popular in recent years because a wireless device has the advantages of portability. A user can obtain information or communicate with others anywhere using a wireless device without being confined to his (or her) location. In general, a wireless device needs to have a transmitting part, a receiving part and an antenna for wireless communication.

In a conventional wireless device, the antenna is mainly a dipole which is formed by a metal rod or a helical cylinder, and is usually extended out from the wireless device. In order for a wireless device to be easily portable, a new trend in manufacturing the device is to make it as compact as possible. Thus, in recent years the design of antennas has been improved greatly. The first improvement is minimizing the size of the antenna. Nevertheless, the conventional antenna has several drawbacks. The antenna itself has significantly enlarged the size of the wireless device. The antenna is extended out from the device, and thus easy to pierce the body of its user. Furthermore, it is easily broken.

To overcome these drawbacks, a foldable antenna has been invented. In general, the foldable antenna can be hidden within the housing of a wireless device. If it is used, the user draws the antenna from the housing. Although a foldable antenna has solved some of the problems, it is still inconvenient to the user.

Recently, a novel antenna design has been disclosed. The concept of patch antennas is employed in the new design. This type of antenna is called "printed circuit antenna". Printed circuit antennas have been utilized in the field of radio communications to provide a light weight antenna. U.S. Pat. No. 5,495,260 to Couture is an example of a simple dipole antenna implemented in the form of a printed circuit antenna. U.S. Pat. No. 4,758,843 to Agrawal shows a planar printed circuit substrate having a plurality of dipole antennas and a feed network including a sum and difference hybrid printed circuit thereon. U.S. Pat. No. 5,206,657 to Downey shows a printed circuit radio frequency antenna comprising a pair of double-sided printed circuit boards spaced apart by standoffs.

An antenna with high directivity has always been desired for its efficiency in direct point-to-point radio communication. It is very useful in radio communication to have a printed circuit antenna with high directivity. In addition to its light weight, a planar printed circuit antenna has the advantage that it can be formed at the same time and on the same substrate with other circuit sections. The wireless transceiver system can use this feature to make an integrated system on a printed circuit board to reduce the manufacturing time and cost. The absence of mechanical structures or connectors in the antenna construction also improves the reliability of the wireless transceiver system.

Unfortunately, the existing printed circuit antennas in various configurations do not provide a simple solution for the high directivity antenna. There is a need to develop a printed circuit antenna which has a planar structure to be integrated with other electronic circuits, exhibits higher directivity than a single dipole antenna, and occupies a relatively smaller area on a substrate.

SUMMARY OF THE INVENTION

This invention has been made to meet the need of a printed circuit antenna with high directivity. The primary object of this invention is to provide a structure of a printed circuit antenna with high directivity. Another object is to provide a printed circuit antenna that can be integrated in a system on a printed circuit board. It is yet also an object to provide a wireless transceiver system with low profile and compact structure.

According to this invention, a wireless transceiver system on a board comprises a printed circuit antenna, a radio frequency circuit and a baseband signal processing circuit. The printed circuit antenna structure includes a reflector, a driven radiating element and at least one director to provide high directivity. Unlike the conventional Yaki-Uda antenna used in a VHF/UHF frequency range, the antenna structure of the present invention is formed on a printed circuit board by direct patterning the conductor layer on the laminated printed circuit board. The layout of other circuit sections are patterned and formed at the same time so that the antenna and circuits are integrated on a print circuit board. This system-on-a-board approach has many advantages. The signals to and from the printed circuit antenna are directly linked to the radio frequency circuit to reduce the signal loss and to avoid any mechanical connection. This wireless system on a board is also compact and light weight.

DETAILED DESCRIPTION OF THE PREFERRED EMBODIMENTS

Figure 1:
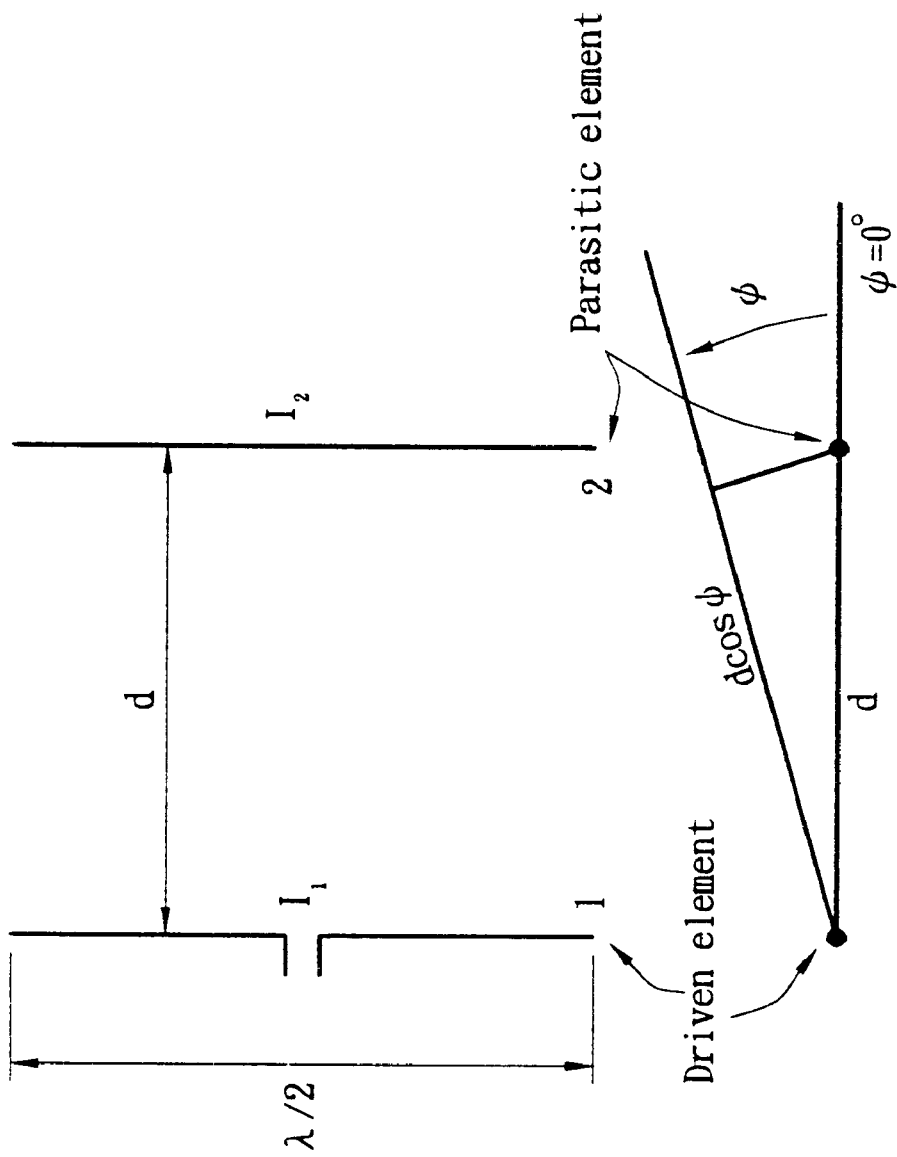
FIG. 1 is a schematic view of an antenna array with one driven dipole and one parasitic element.

Referring to "Antennas" of John D. Kraus, 2nd edition, an antenna array in a free space consisting of one driven $\lambda/2$ dipole element (element 1) and one parasitic element (element 2) is shown in FIG. 1. In the figure, both elements are aligned in the vertical direction so that the azimuth angle $\phi$ is as indicated. Through complex calculations by using antenna theory, one can obtain that the gain in field intensity (as a function of φ) of the array with respect to a single λ/2 antenna with the same power input is:

$$G(\phi) = \sqrt{\frac{R_{1l} + R_{1L}}{R_{1l} + R_{1L} - |Z_{12}^2/Z_{22}|\cos(2\tau_m - \tau_2)}} \times$$

$$(1 + |Z_{12}/Z_{22}| ang(\xi + d_\tau\cos\phi))$$

where $R_{12}+j X_{12}=Z_{12}$=mutual impedance of elements 1 and 2, $R_{22}+j X_{22}=Z_{22}$=self impedance of the parasitic element, $$d_\tau = \frac{2\pi}{\lambda}d$$

$\tau_m$: Phase angle of $Z_{12}$
$\tau_2$: Phase angle of $Z_{22}$
$\xi=\pi+\tau_m-\tau_2$ If $Z_{22}$ is made very large by detuning the parasitic element, then equation (1) reduces to unity. In other words, the field intensity of the array becomes the same as a single λ/2 dipole comparison antenna. If the equation is further analyzed, one can draw the following two conclusions. One is that when the λ/2 parasitic dipole element is inductive (longer than its resonant length), it acts as a reflector. The other is that when the λ/2 parasitic dipole element is capacitive (shorter than its resonant length), it acts as a director. Therefore, the antenna array may be constructed with both a reflector and a director. From further induction by complex calculation and antenna theory, it is also known that if the number of directors is increased, the antenna directivity will increase. However, if the number of reflectors is increased, the antenna directivity has no effect.

According to the aforementioned analysis and numerous experiments and testing, an antenna array which contains a dipole, a reflector and at least one director arranged on a printed circuit board has been designed in the present invention. The design meets the trend of being compact and light-weight and the antenna has very high directivity.

Figure 2:
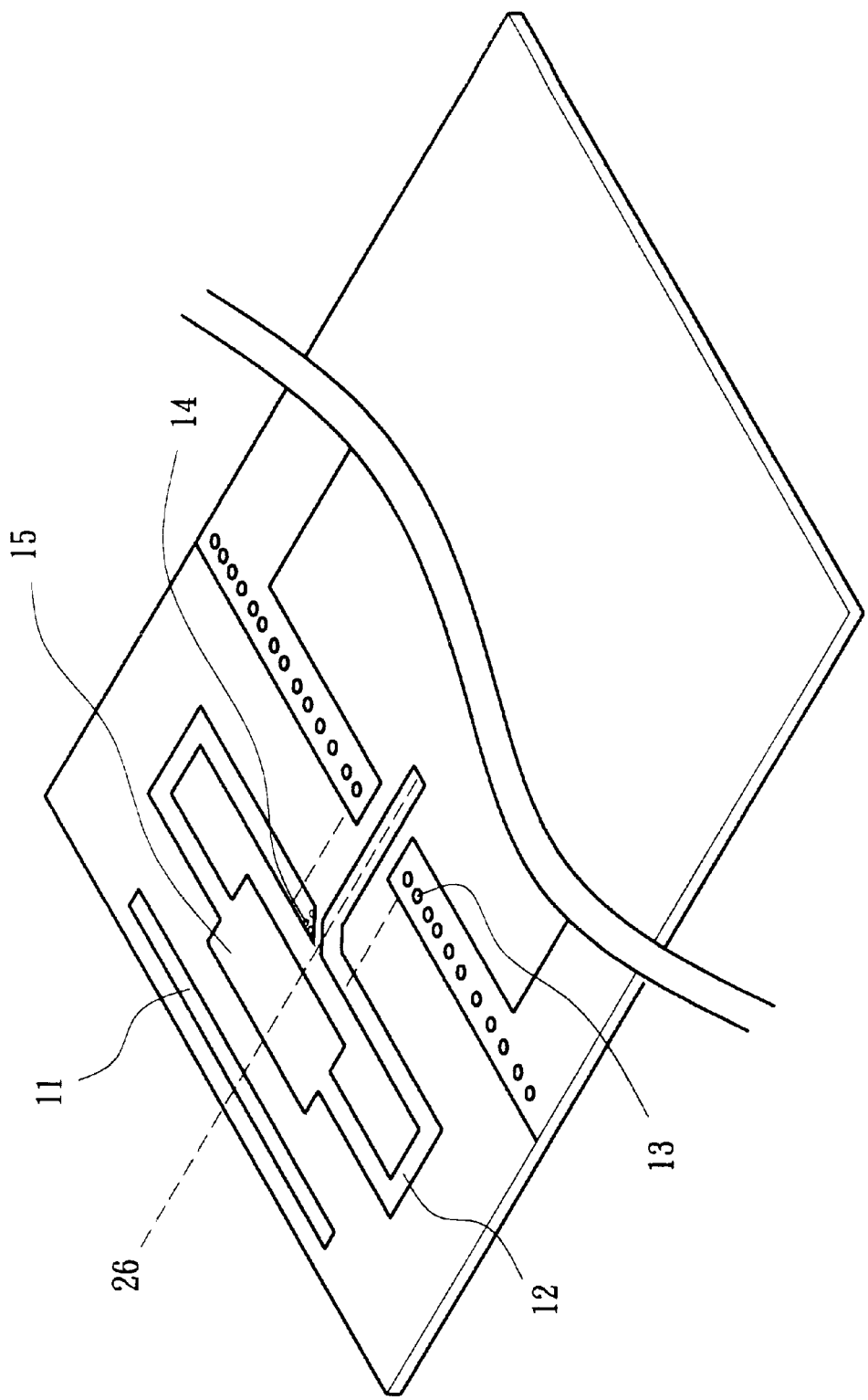
FIG. 2 is a front plan view of the directional printed circuit antenna according to the first embodiment of the present invention.
Figure 3:
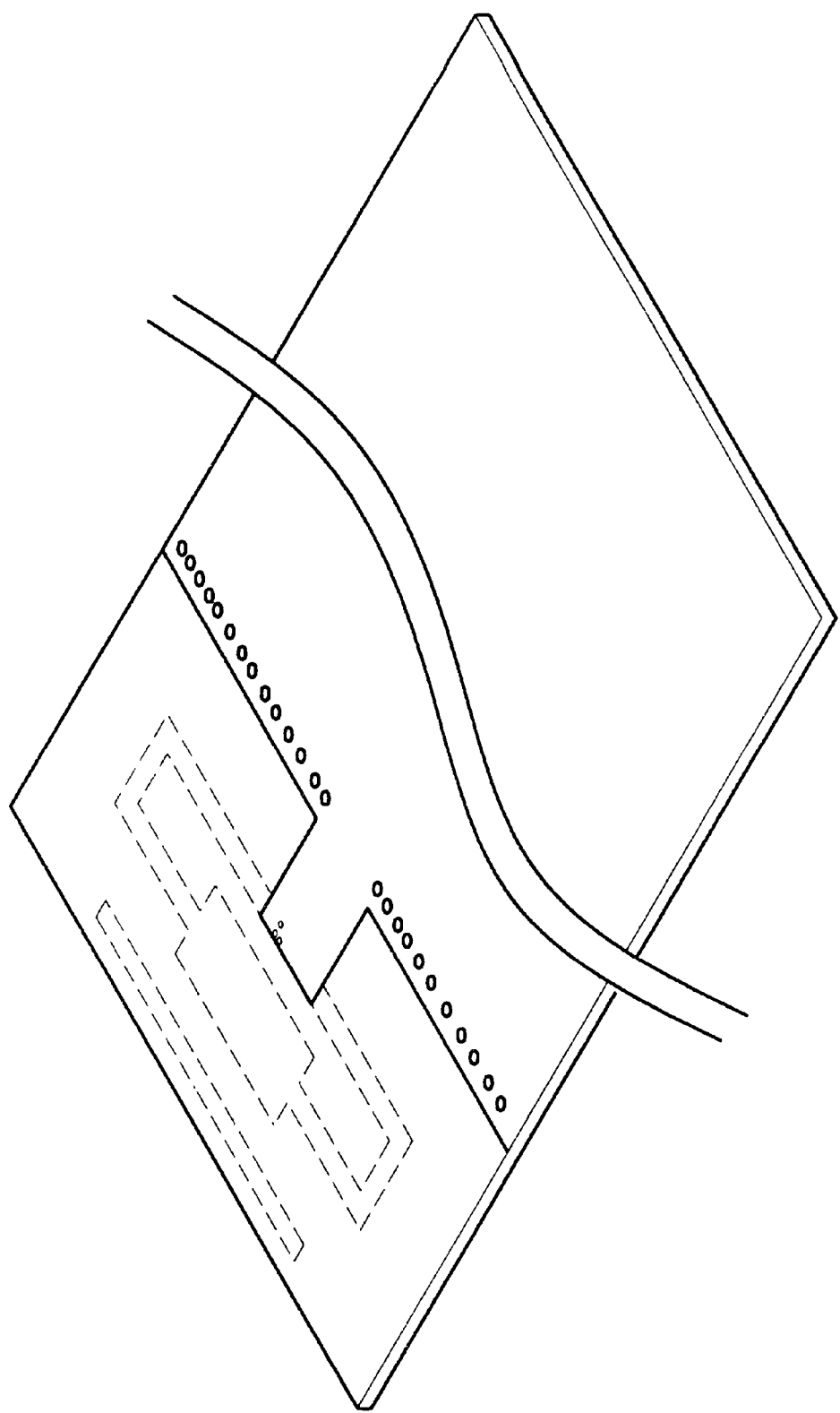
FIG. 3 is a back plan view of the directional printed circuit antenna according to the first embodiment of the present invention.

Referring to FIG. 2, the front plan view of a directional printed circuit antenna of the first embodiment in accordance with the present invention is illustrated. FIG. 3 shows the back plan view of the same antenna. In both figures, the conductors which are invisible from the view are shown in dotted lines. The substrates are preferably constructed by conventional copper-clad epoxy fiberglass.

As shown in FIG. 2, the directional printed circuit antenna comprises a strip conductor called director 11 along the edge of the substrate, a reflector 13 formed by part of the ground area, and a driven element 12 positioned therebetween. The driven element 12 is a folded dipole. One end of the dipole is connected to a conductive line 14 on the same side of the substrate. The other end is connected to a conductive line on the other side of the substrate by means of plated through holes. All the linear dimensions scale with the wavelength in the intended operation frequency range. For intended operation in ISM band (2.4 GHz~2.48 GHz), the half-wavelength is around 6 cm, therefore, the width is 6 cm. The central portion of the strip conductor of the folded dipole can be widened to adjust the impedance matching. Extra tuning capability can provide end-fire radiation along the axis 26 with directivity almost 7.5 dB above that of a single dipole antenna.

Figure 4:
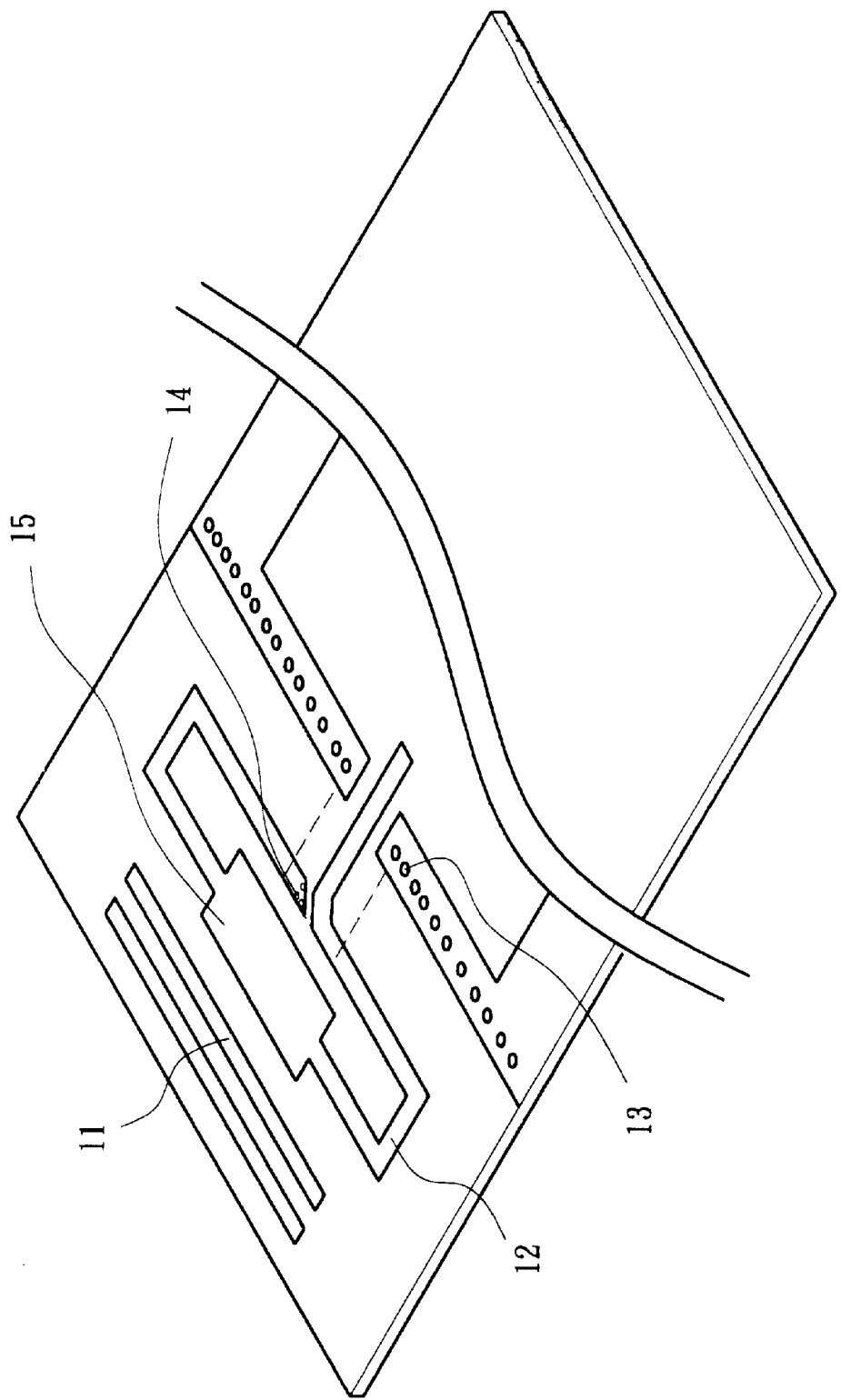
FIG. 4 is a front plan view of the directional printed circuit antenna according to the second embodiment of the present invention.

In FIG. 4, a directional printed circuit antenna of the second embodiment in accordance with the present invention is illustrated. The structure of this embodiment is the same as that shown in FIG. 3 except that the directional printed circuit antenna shown in FIG. 4 comprises two strip directors along the edge of the substrate. According to the present invention, this design has a stronger directivity.

Figure 5:
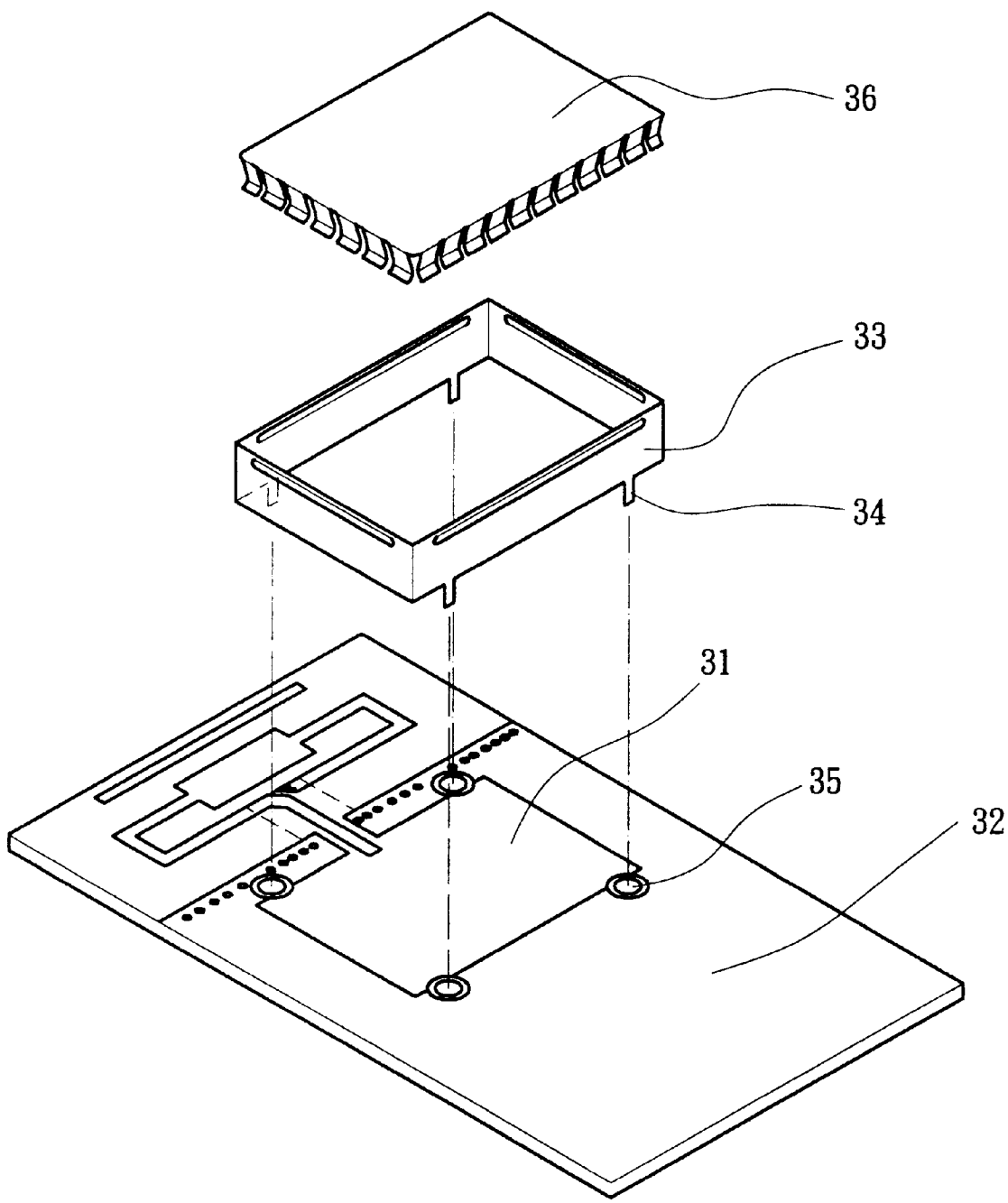
FIG. 5 is an exploded view showing the three sections of a wireless transceiver system according to the present invention.

FIG. 5 shows the preferred embodiment of a wireless transceiver system on a board according to this invention. The RF circuit 31 is surrounded by ground area 32 and a metallic wall 33 which has small tabs 34 to be assembled and soldered into the corresponding plated holes 35 in the ground area in order to have good EMI isolation for proper operation of the RF circuit. A metallic cover 36 is also needed for covering the RF circuit. The metallic wall 33 and cover 36 form an enclosure for isolating the RF circuit from possible interference and reducing leakage radiation from the RF circuit. The baseband processing circuit can be built on both sides of the substrate which are not occupied by the printed circuit antenna, the RF circuit and the ground.

Figure 6:
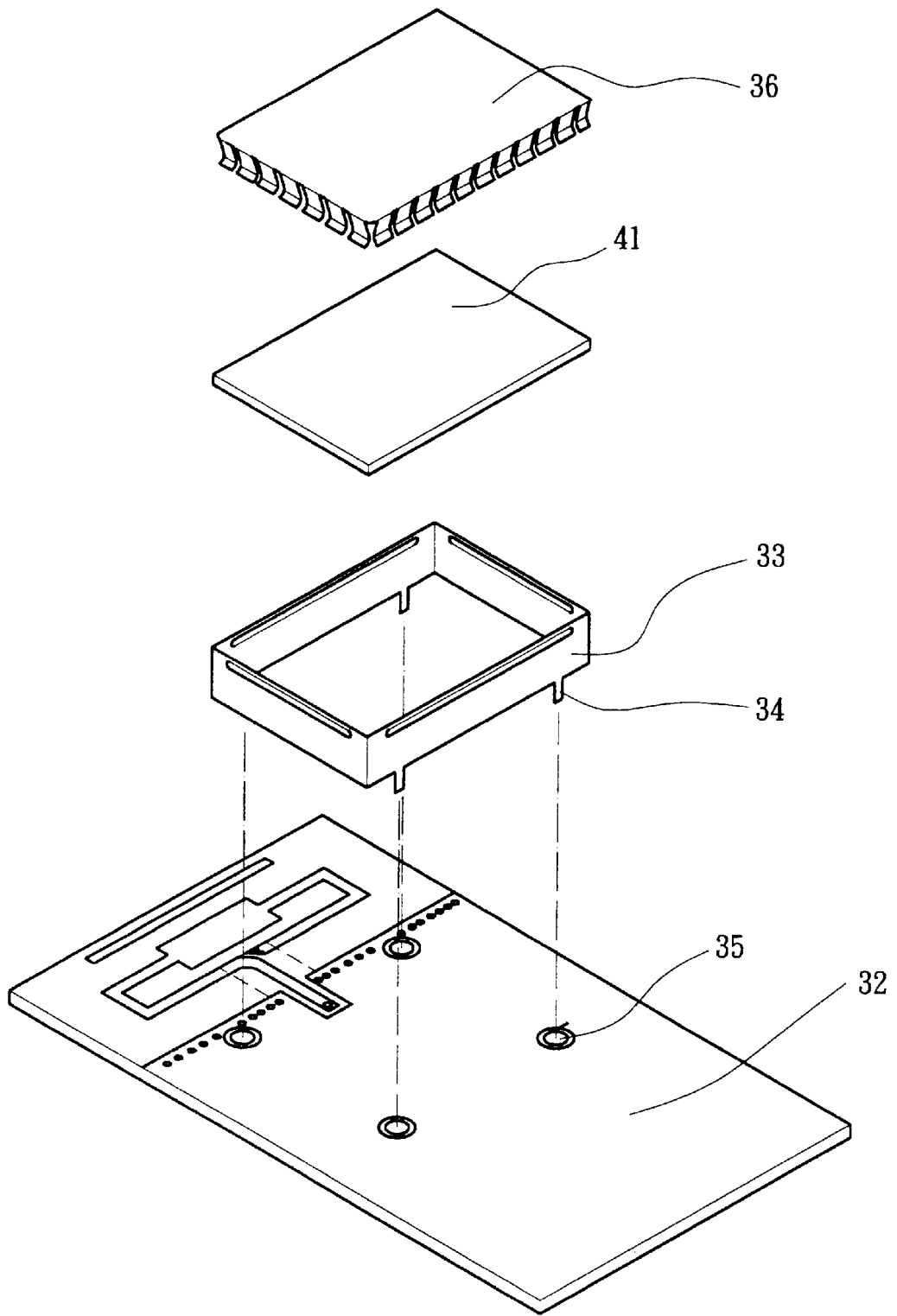
FIG. 6 is an exploded view for another embodiment of the wireless transceiver system in which the RF circuit is constructed as a separate module.

In FIG. 6 an alternative embodiment of the invention is shown. This embodiment achieves better isolation of the RF circuit and baseband processing circuit by making the RF circuit as a module in a separate printed circuit board 41. The backside ground plane of the RF module is soldered to the ground area of the substrate to insure good contact for the grounds. The signal path between different sections of the system including antenna, RF circuit, baseband processing circuit can be connected by metallic pins, leads, wires or plated-through holes.

Figure 7:
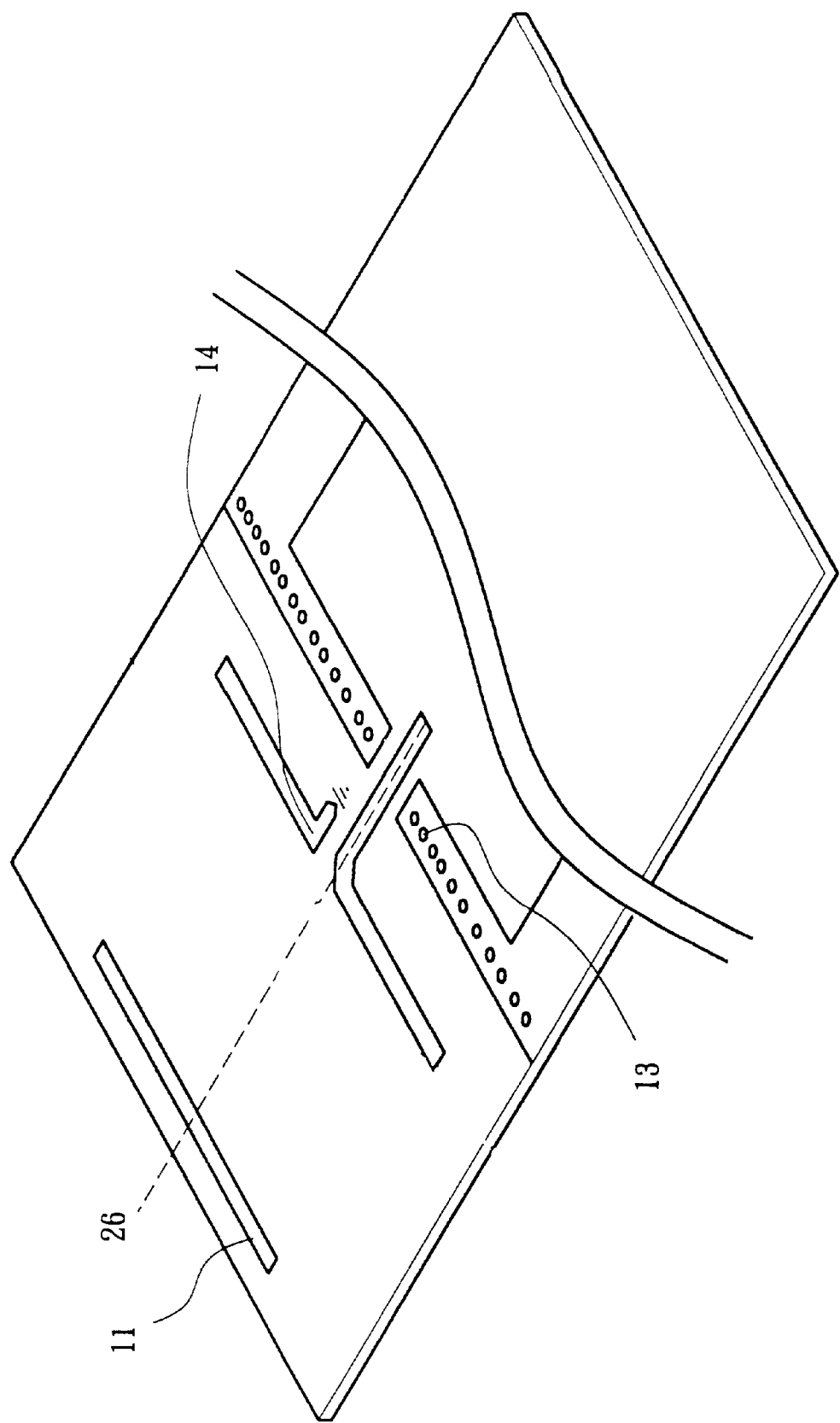
FIG. 7 is a front plan view of the directional printed circuit antenna according to another embodiment of the present invention in which the driven element is a half wavelength dipole.

Referring to FIG. 7, another embodiment of the present invention is shown. All components shown in FIG. 6 are identical to those in FIG. 2, except that the folded dipole is replaced by a λ/2 dipole element. On end of the diople element is connected to a conductive line 14 on the same side of the substrate. The other end is connected to a conductive line on the other side of the substrate by means of plated through holes. All linear dimensions should scale with the wavelength in the intended operation frequency range.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, an such substitutions and modifications are intended to be embraced within the scope of the invention as defined in the appended claims.

What is claimed is:

1. A wireless transceiver comprising:
    a dielectric substrate having an RF circuit and a baseband processing circuit mounted thereon;
    a printed circuit antenna including at least one director formed by a strip conductor on a first major surface of said substrate, a reflector formed by the edge of a ground area on the first major surface of said substrate, and a dipole antenna formed by a strip conductor on the first major surface of said substrate and positioned between said reflector and said director; and
    a feed structure to said dipole antenna including a first strip conductor disposed on the first major surface of said substrate and a second strip conductor disposed on a second major surface of said substrate, said second strip conductor on said second major surface being connected electrically to said dipole antenna on said first major surface by means of plated-through holes.

2. The wireless transceiver as claimed in claim 1, wherein said dipole antenna is a folded dipole having a resonant frequency at the intended operating frequency of said dipole antenna.

3. The wireless transceiver as claimed in claim 2, wherein a center portion of the strip conductor of said folded dipole is widened for impedance matching.

4. The wireless transceiver as claimed in claim 1, wherein said dipole antenna is a half wavelength dipole having a resonant frequency at the intended operating frequency of said dipole antenna.

5. The wireless transceiver as claimed in claim 1, wherein said RF circuit is surrounded by metallic walls and a metallic cover except for narrow openings for passing signal paths.

6. The wireless transceiver as claimed in claim 1, wherein said dielectric substrate is a semi-insulating compound semiconductor substrate.

7. The wireless transceiver as claimed in claim 1, wherein said dielectric substrate is a printed circuit board.

8. The wireless radio transceiver as claimed in claim 7, wherein said printed circuit board is constructed by copper-clad epoxy fiberglass.

9. A wireless transceiver comprising: a dielectric substrate having an RF circuit and a baseband processing circuit mounted thereon; and
   a printed circuit antenna including at least one director formed by a strip conductor on said substrate, a reflector formed by the edge of a ground area on said substrate, and a dipole antenna formed by a strip conductor on said substrate and positioned between said reflector and said director;
   wherein said RF circuit is constructed on a separate dielectric board to form a RF module having a backside ground plane soldered to the ground area of said substrate for insuring good ground contact, the signal paths between said printed circuit antenna, said RF module and said baseband processing circuit being connected by metallic pins wires, leads, or plated-through holes.

10. The wireless transceiver as claimed in claim 9, wherein said dipole antenna is a folded dipole having a resonant frequency at the intended operating frequency of said dipole antenna.

11. The wireless transceiver as claimed in claim 10, wherein a center portion of the strip conductor of said folded dipole is widened for impedance matching.

12. The wireless transceiver as claimed in claim 9, wherein said dipole antenna is a half wavelength dipole having a resonant frequency at the intended operating frequency of said dipole antenna.

13. The wireless transceiver as claimed in claim 9, wherein said RF circuit is surrounded by metallic walls and a metallic cover except for narrow openings for passing signal paths.

14. The wireless transceiver as claimed in claim 9, wherein said dielectric substrate is a semi-insulating compound semiconductor substrate.

15. The wireless transceiver as claimed in claim 9, wherein said dielectric substrate is a printed circuit board.

16. The wireless radio transceiver as claimed in claim 15, wherein said printed circuit board is constructed by copper-clad epoxy fiberglass.

* * * * *